United States Patent
Young et al.

(10) Patent No.: US 6,268,287 B1
(45) Date of Patent: Jul. 31, 2001

(54) POLYMERLESS METAL HARD MASK ETCHING

(75) Inventors: Bao-Ju Young, I-Lan; Chia-Shiung Tsai; Ming-Hsin Huang, both of Hsin-chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/419,109

(22) Filed: Oct. 15, 1999

(51) Int. Cl.[7] .................................................. H01L 21/44
(52) U.S. Cl. ........................ 438/671; 438/688; 438/717; 438/720
(58) Field of Search ................................ 438/653, 656, 438/669, 671, 688, 711, 717, 720

(56) References Cited

U.S. PATENT DOCUMENTS

| | | | |
|---|---|---|---|
| 4,915,779 | 4/1990 | Srodes et al. | 438/717 |
| 5,277,750 | * 1/1994 | Frank | 438/720 |
| 5,369,053 | 11/1994 | Fang | 438/637 |
| 5,665,641 | 9/1997 | Shen et al. | 438/643 |
| 5,847,463 | * 12/1998 | Trivedi et al. | 257/751 |
| 5,968,711 | * 10/1999 | Lee et al. | 430/313 |
| 5,981,398 | * 11/1999 | Tsai et al. | 438/710 |
| 6,043,163 | * 3/2000 | Tsai et al. | 438/706 |
| 6,080,529 | * 6/2000 | Ye et al. | 438/318 |

FOREIGN PATENT DOCUMENTS 11-214370  *  8/1999  (JP) ........................... H01L/21/3065

OTHER PUBLICATIONS

Park, C.K., et al., "Sub–Quarter–Micron Al Etching Technology Using SiON Hard Mask . . . ," Microprocesses and Nanotechnology Conference, 1999, Digest of Papers, pp. 218–219.*

Ravijumar, R., et al., "Challenges of Aluminum RIE Technology at sub 0.45μ Pitches," Interconnect Technology, IEEE International Conference, 1999, pp. 203–205.*

* cited by examiner

Primary Examiner—T. N. Quach
(74) Attorney, Agent, or Firm—George O. Saile; Stephen B. Ackerman; Rosemary L. S. Pike

(57) ABSTRACT

A new method of etching metal lines without polymer residue using a composite hard mask and two-step hard mask etching process is described. An insulating layer is provided on a semiconductor substrate. A first barrier metal layer is deposited overlying the insulating layer. A metal layer is deposited overlying the barrier metal layer. A second barrier metal layer is deposited overlying the metal layer. A composite hard mask layer is deposited overlying the second barrier metal layer. A photoresist mask is formed overlying the composite hard mask layer having openings where openings are to be made within the metal layer. First, the composite hard mask layer is partially etched away where it is not covered by the photoresist mask. Second, most of the composite hard mask layer is overetched away leaving a patterned hard mask and a portion of the hard mask layer within the openings whereby a polymer is formed within the openings. Since the second barrier metal layer is covered by the hard mask layer within the openings, the polymer does not contain metallic atoms. The polymer is removed. Thereafter, the photoresist mask is removed. The metal layer and barrier metal layers not covered by the patterned hard mask are etched away to form metal lines wherein the hard mask layer within the openings is also removed.

30 Claims, 4 Drawing Sheets

POLYMERLESS METAL HARD MASK ETCHING

BACKGROUND OF THE INVENTION (1) Field of the Invention

The invention relates to a method of photolithographic etching of metal lines, and more particularly, to a method of photolithographic etching of metal lines without polymer residue in the manufacture of integrated circuits.

(2) Description of the Prior Art

Aluminum and aluminum alloys are often used to form metal lines in integrated circuit processing. To prevent aluminum spiking, a barrier metal layer comprising titanium, titanium nitride, titanium tungsten, or the like, is deposited underlying the aluminum layer. A second barrier metal layer also comprising titanium or titanium nitride is deposited overlying the aluminum layer as both a barrier and an anti-reflective coating layer. An oxide hard mask layer is typically formed over the metal stack. In opening the oxide hard mask, the second barrier metal layer serves as the etch stop. During this etching, a polymer will be generated which includes titanium atoms. This metallic polymer has small solubility to alkaline stripper and thus remains as residue. It is desired to remove all of the polymer to obtain a polymerless hard mask metal etching.

U.S. Pat. No. 4,915,779 to Srodes et al discloses a PE-oxide hard mask for metal etching. U.S. Pat. No. 5,665,641 to Shen et al teaches a silicon oxide or silicon nitride hard mask wherein the hard mask etching chemistry comprises $CHF_3$ and $CF_4$. U.S. Pat. No. 5,369,053 to Fang discloses a silicon oxynitride hard mask wherein the first etching comprises fluorine-based chemistry and etches through both the hard mask layer and the top barrier metal layer. None of these patents mentions the problem of metallic polymers.

SUMMARY OF THE INVENTION

A principal object of the present invention is to provide an effective and very manufacturable method of etching metal lines.

Another object of the present invention is to provide a method of etching metal lines without polymer residue.

A further object of the present invention is to provide a method of etching metal lines using a composite hard mask.

Yet another object of the present invention is to provide a method of etching metal lines using a composite hard mask and two-step hard mask etching process.

A still further object of the present invention is to provide a method of etching metal lines using a composite hard mask and two-step hard mask etching process to prevent the inclusion of titanium atoms within the polymer formed during hard mask etching.

Yet another object of the present invention is to provide a method of etching metal lines without polymer residue using a composite hard mask and two-step hard mask etching process.

In accordance with the objects of this invention a new method of etching metal lines without polymer residue using a composite hard mask and two-step hard mask etching process is achieved. An insulating layer is provided on a semiconductor substrate. A first barrier metal layer is deposited overlying the insulating layer. A metal layer is deposited overlying the barrier metal layer. A second barrier metal layer is deposited overlying the metal layer. A composite hard mask layer is deposited overlying the second barrier metal layer. A photoresist mask is formed overlying the composite hard mask layer having openings where openings are to be made within the metal layer. First, the composite hard mask layer is partially etched away where it is not covered by the photoresist mask. Second, most of the composite hard mask layer is overetched away leaving a patterned hard mask and a portion of the hard mask layer within the openings whereby a polymer is formed within the openings. Since the second barrier metal layer is covered by the hard mask layer within the openings, the polymer does not contain metallic atoms. The polymer is removed. Thereafter, the photoresist mask is removed. The metal layer and barrier metal layers not covered by the patterned hard mask are etched away to form metal lines wherein the hard mask layer within the openings is also removed.

BRIEF DESCRIPTION OF THE DRAWINGS

In the accompanying drawings forming a material part of this description, there is shown.

DESCRIPTION OF THE PREFERRED EMBODIMENTS

Figure 1:
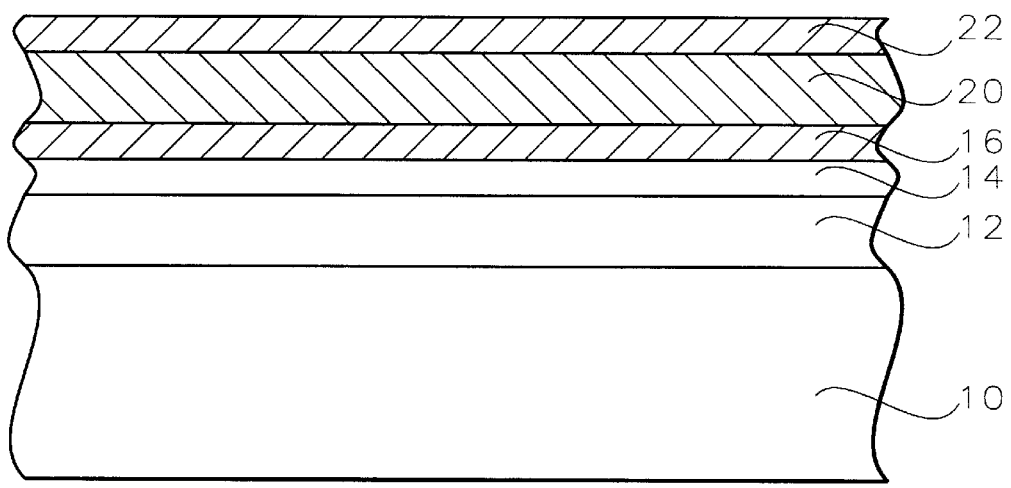
FIGS. 1 through 7 schematically illustrate in cross-sectional representation a preferred embodiment of the present invention.

Referring now more particularly to FIG. 1, there is illustrated a portion of a partially completed integrated circuit. Semiconductor substrate 10 is preferably composed of monocrystalline silicon. Semiconductor device structures, such as gate electrodes and source and drain regions, not shown, may be fabricated in and on the semiconductor substrate. A thick insulating layer of silicon dioxide or borophosphosilicate glass (BPSG), or the like, is blanket deposited over the semiconductor device structures. The semiconductor device structures and the overlying thick insulating layer are represented in the drawings by layer 12.

Now the metal stack will be formed. A first barrier layer is deposited over the insulating layer 12. This may comprise a first layer 14 of titanium having a thickness of between about 200 and 300 Angstroms and a second layer 16 of titanium nitride having a thickness of between about 250 and 350 Angstroms. The metal layer 20, typically aluminum or an aluminum alloy such as AlCu, is sputter deposited over the first barrier layer to a thickness of between about 4000 and 5000 Angstroms. A second barrier metal layer 22 is deposited over the metal layer 20. This layer 22 may comprise titanium nitride having a thickness of between about 250 and 350 Angstroms and acts as a barrier and anti-reflective coating (ARC) layer.

Figure 2:
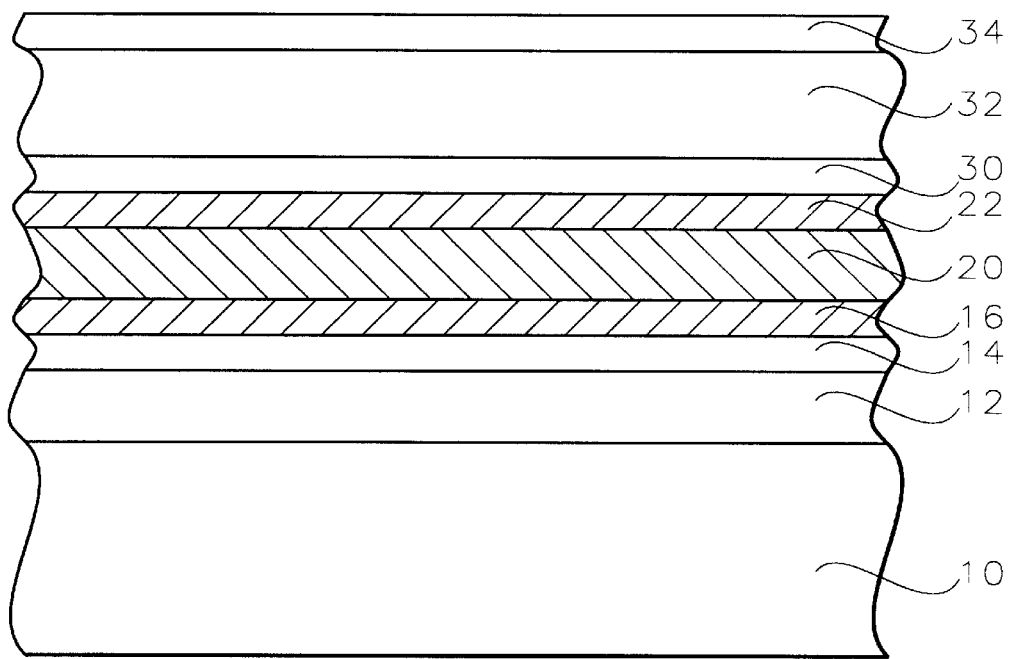

Next, referring to FIG. 2, the composite hard mask layer will be formed over the metal stack. A first layer of silicon oxynitride 30 is deposited overlying the ARC layer 22 to a thickness of between about 250 and 350 Angstroms. A second layer silicon oxide layer 32 is deposited by plasma-enhanced chemical vapor deposition over the oxynitride layer 30 to a thickness of between about 2000 and 3000 Angstroms. A final layer of silicon oxynitride 34 is deposited over the silicon oxide layer 32 to a thickness of between about 600 and 700 Angstroms.

Figure 3:
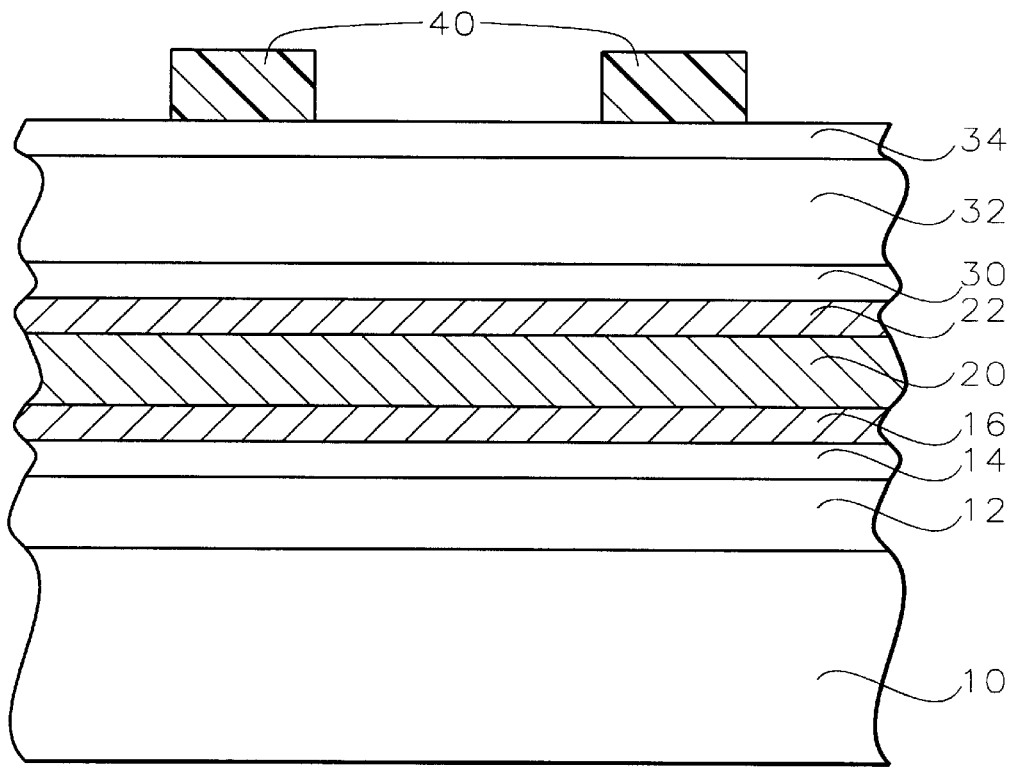

A layer of photoresist is coated over the composite hard mask layer and is exposed and developed to form the photoresist mask 40, shown in FIG. 3.

Conventionally, the hard mask is etched using a single etching gas chemistry, such as $C_4F_8/C_2F_6/Ar$. The etch stops at the titanium nitride layer 22. During etching, a polymer is formed on the sidewalls of the etched openings. Since the titanium nitride layer is exposed during etching, titanium atoms are incorporated within the polymer. This metallic polymer cannot be removed using the conventional alkaline stripper.

The process of the present invention uses a two-step hard mask etching process with an etch stop at the first silicon oxynitride layer. The titanium nitride layer is covered by a portion of the silicon oxynitride layer, preventing the incorporation of titanium atoms in the polymer. This non-metallic polymer can be removed by the conventional alkaline stripping method.

Figure 4:
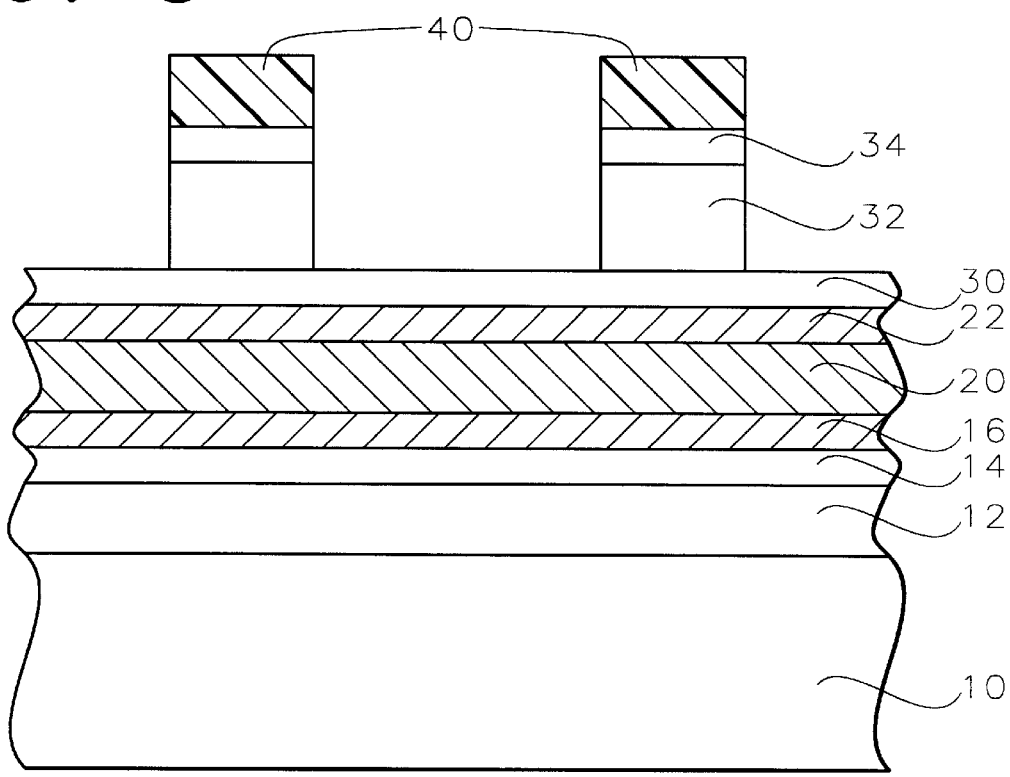

The two-step etching hard mask process of the present invention will now be described. Referring now to FIG. 4, the top two layers of the composite hard mask are etched in the first etching step. This main etch uses $C_2F_6/C_4F_8/O_2/Ar$ chemistry with an etch stop at the silicon oxynitride layer 30.

Specifically, $C_2F_6$ gas is flowed at between 14 and 15.4 sccm, $C_4F_8$ gas is flowed at between 6 and 6.6 sccm, $O_2$ gas is flowed at between 3 and 3.3 sccm, and Ar gas is flowed at between 190 and 209 sccm under a pressure of 3 to 3.3 mTorr, top power of 1650 to 1815 watts, and bottom power of 1800 to 1980 watts.

Figure 5:
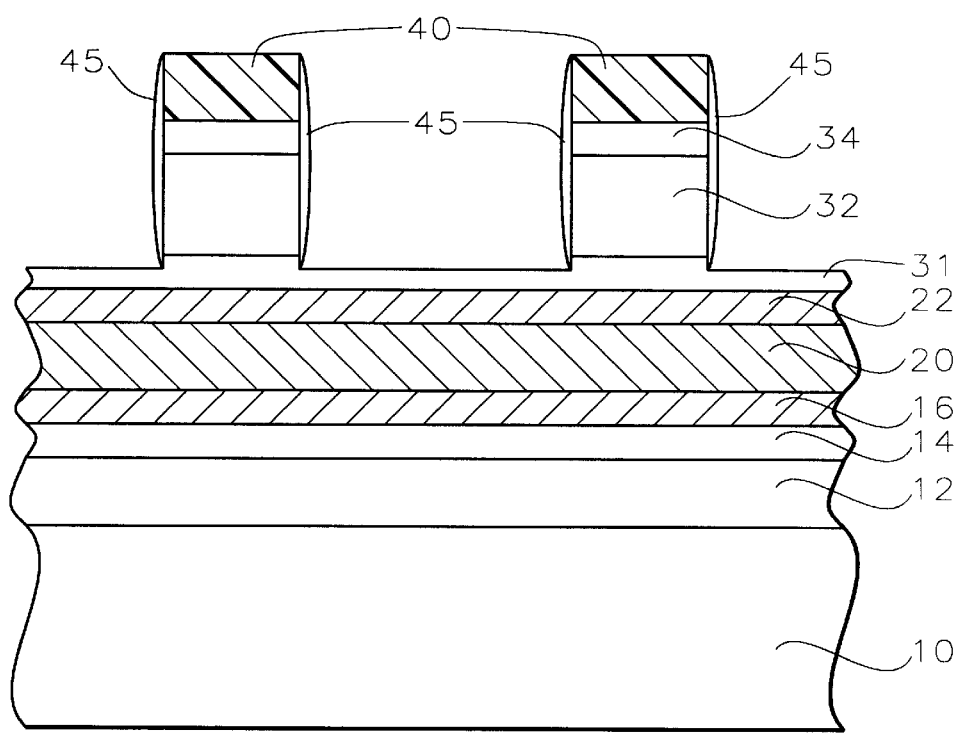

Referring now to FIG. 5, a portion of the bottom silicon oxynitride layer 30 is etched away in an overetch step. This overetch uses $C_2F_6/C_4F_8/CO/Ar$ chemistry and proceeds for 60 to 70 seconds. The silicon oxynitride layer 31 remaining after this overetch has a thickness of between about 100 and 200 Angstroms.

Specifically, $C_2F_6$ gas is flowed at between 14 and 15.4 sccm, $C_4F_8$ gas is flowed at between 12 and 13.2 sccm, CO gas is flowed at between 200 and 220 sccm, and Ar gas is flowed at between 190 and 209 sccm under a pressure of about 7 mTorr, top power of 1650 to 1815 watts, and bottom power of 600 to 660 watts. The use of CO gas rather than $O_2$ gas in this overetching prevents etching through of the silicon oxynitride layer.

Polymer 45 is shown on the sidewalls of the composite hard mask within the openings. Since the titanium nitride layer 22 is covered by the silicon oxynitride layer 31, the polymer 45 is non-metallic.

Figure 6:
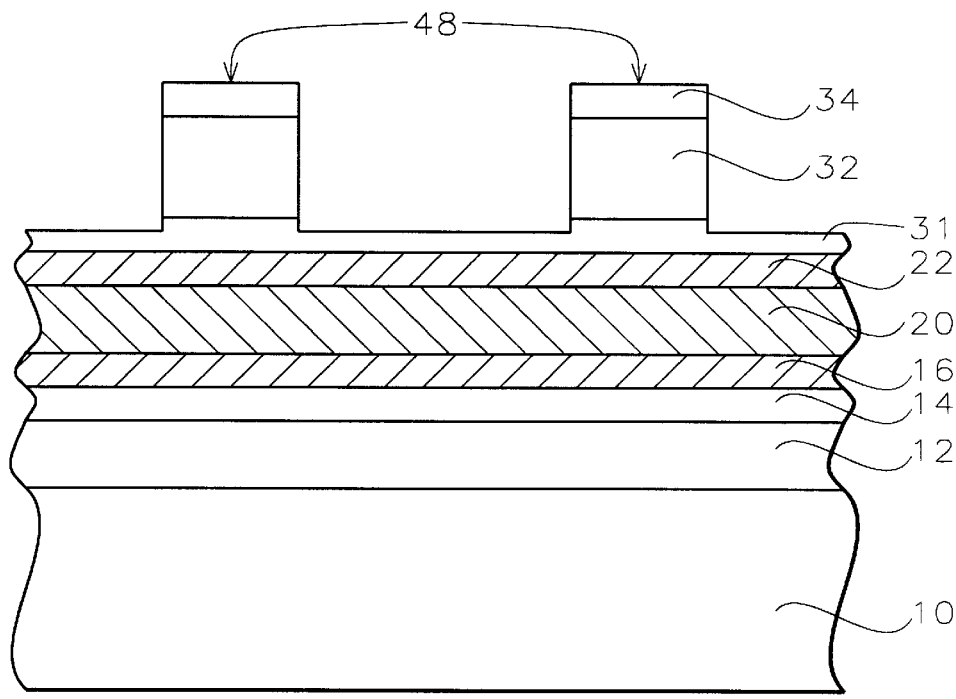

The photoresist mask is removed, as shown in FIG. 6. The polymer 45 is removed by a conventional ashing process using a hot alkaline stripper. This leaves the hard mask 48, as shown in FIG. 6, along with the thin portion of the silicon oxynitride layer 31 within the openings.

Now, the metal stack is etched using a conventional metal etch recipe, such as $BCl_3/Cl_2/N_2$ chemistry where it is not covered by the hard mask 48. This metal etch will also remove the remaining thin silicon oxynitride layer 31. During metal etching, the hard mask 48 will be removed partially. However, the selectivity of metal to oxide is quite high, so that most of the hard mask will remain after the metal etch.

Figure 7:
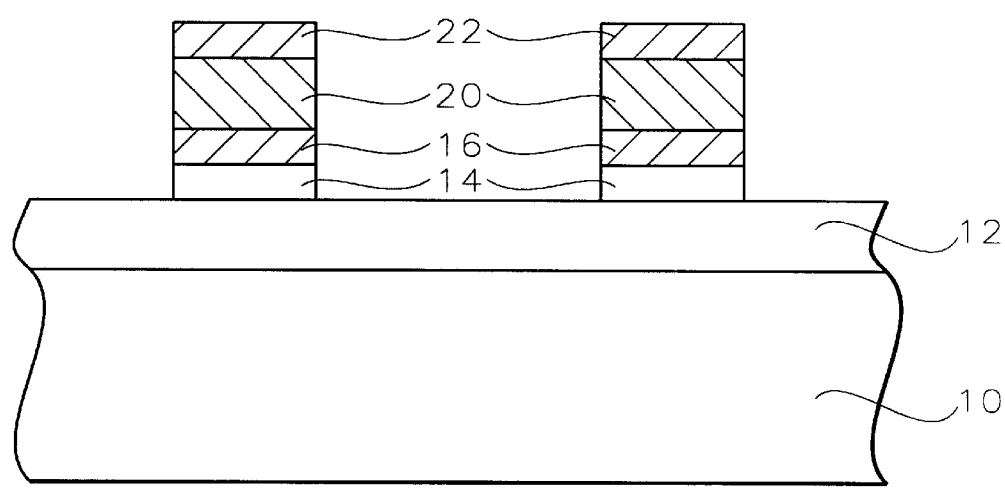

The resulting metal lines are illustrated in FIG. 7 after the hard mask 48 has been removed, although it is not necessary to remove the hard mask. Processing continues as is conventional in the art to complete the integrated circuit device.

The process of the present invention results in a polymer-less metal hard mask etching process. A composite hard mask is used wherein a portion of the hard mask remains over the top layer of the metal stack. This prevents the formation of a metallic polymer allowing the polymer to be completely removed by conventional means. A two-step etching process is used to form the hard mask. The first etch has an etch stop at the first layer of the composite hard mask. The second step is an overetch to remove most of the first layer of the composite hard mask, leaving only a thin portion covering the top metal layer.

While the invention has been particularly shown and described with reference to the preferred embodiments thereof, it will be understood by those skilled in the art that various changes in form and details may be made without departing from the spirit and scope of the invention.

What is claimed is:

1. A method of forming metal lines in the fabrication of an integrated circuit comprising:

provding an insulating layer on a semiconductor substrate;

depositing a first barrier metal layer overlying said insulating layer;

depositing a metal layer overlying said barrier metal layer;

depositing a second barrier metal layer overlying said metal layer;

depositing a composite hard mask layer overlying said second barrier metal layer;

forming a photoresist mask overlying said composite hard mask layer having openings where openings are to be made within said metal layer;

first partially etching away said composite hard mask layer where it is not covered by said photoresist mask;

second overetching away most of said composite hard mask layer not covered by said photoresist mask leaving a patterned hard mask and a portion of said hard mask layer within said openings whereby a polymer is formed within said openings;

removing said photoresist mask;

thereafter removing said polymer;

thereafter third etching away said metal layer and said first and second barrier metal layers not covered by said patterned hard mask to form said metal lines wherein said hard mask layer within said openings is also removed; and completing said fabrication of said integrated circuit.

2. The method according to claim 1 wherein said insulating layer covers semiconductor device structures in and on said semiconductor substrate wherein said semiconductor device structures include gate electrodes and source and drain regions.

3. The method according to claim 1 wherein said first barrier layer comprises titanium nitride having a thickness of between about 250 and 350 Angstroms.

4. The method according to claim 1 wherein said first barrier layer comprises a titanium layer having a thickness of between about 200 and 300 Angstroms underlying a titanium nitride layer having a thickness of between about 250 and 350 Angstroms.

5. The method according to claim 1 wherein said metal layer comprises AlCu having a thickness of between about 4000 and 5000 Angstroms.

6. The method according to claim 1 wherein said second barrier layer comprises titanium nitride having a thickness of between about 250 and 350 Angstroms.

7. The method according to claim 1 wherein said composite hard mask layer comprises:
- a first layer of silicon oxynitride having a thickness of between about 250 and 350 Angstroms;
- a second layer of silicon oxide having a thickness of between about 2000 and 3000 Angstroms; and
- a third layer of silicon oxynitride having a thickness of between about 600 and 700 Angstroms.

8. The method according to claim 1 wherein said step of first partially etching away said composite hard mask layer comprises $C_2F_6$, $C_4F_8$, $O_2$, and Ar chemistry.

9. The method according to claim 7 wherein said step of first partially etching away said composite hard mask layer comprises etching away said second and third layers of said composite hard mask.

10. The method according to claim 1 wherein said step of second overetching away most of said composite hard mask layer comprises $C_2F_6$, $C_4F_8$, CO, and Ar chemistry.

11. The method according to claim 7 wherein said step of second overetching away most of said composite hard mask layer comprises etching away a portion of said first silicon oxynitride layer and wherein said hard mask layer within said openings comprises a portion of said first silicon oxynitride layer.

12. The method according to claim 1 wherein said polymer does not contain metal atoms since said hard mask layer remains within said openings covering said second barrier metal layer.

13. The method according to claim 1 wherein said step of removing said polymer comprises ashing using an alkaline stripper.

14. A method of forming metal lines in the fabrication of an integrated circuit comprising:
- providing an insulating layer on a semiconductor substrate;
- depositing a first barrier metal layer overlying said insulating layer;
- depositing a metal layer overlying said barrier metal layer;
- depositing a second barrier metal layer overlying said metal layer;
- depositing a composite hard mask layer overlying said second barrier metal layer wherein said composite hard mask layer comprises a first layer of silicon oxynitride underlying a second layer of silicon oxide underlying a third layer of silicon oxynitride;
- forming a photoresist mask overlying said composite hard mask layer having openings where openings are to be made within said metal layer;
- first partially etching away said third and second layers of said composite hard mask layer where it is not covered by said photoresist mask with an etch stop at said first silicon oxynitride layer;
- second overetching away most of remaining said first silicon oxynitride layer of said composite hard mask layer not covered by said photoresist mask leaving a patterned hard mask and a portion of said first silicon oxynitride layer within said openings whereby a polymer is formed within said openings on the sidewalls of said patterned hard mask;
- removing said photoresist mask;
- thereafter removing said polymer;
- thereafter third etching away said metal layer and said first and second barrier metal layers not covered by said patterned hard mask to form said metal lines wherein said portion of said first silicon oxynitride layer of said composite hard mask layer within said openings is also removed; and
- completing said fabrication of said integrated circuit.

15. The method according to claim 14 wherein said insulating layer covers semiconductor device structures in and on said semiconductor substrate wherein said semiconductor device structures include gate electrodes and source and drain regions.

16. The method according to claim 14 wherein said first barrier layer comprises a titanium layer having a thickness of between about 200 and 300 Angstroms underlying a titanium nitride layer having a thickness of between about 250 and 350 Angstroms.

17. The method according to claim 14 wherein said metal layer comprises AlCu having a thickness of between about 4000 and 5000 Angstroms.

18. The method according to claim 14 wherein said second barrier layer comprises titanium nitride having a thickness of between about 250 and 350 Angstroms.

19. The method according to claim 14 wherein said composite hard mask layer has a thickness of between about 3000 and 5000 Angstroms.

20. The method according to claim 14 wherein said step of first partially etching away said composite hard mask layer comprises $C_2F_6$, $C_4F_8$, $O_2$, and Ar chemistry.

21. The method according to claim 14 wherein said step of second overetching away most of said composite hard mask layer comprises $C_2F_6$, $C_4F_8$, CO, and Ar chemistry.

22. The method according to claim 14 wherein said polymer does not contain metal atoms since said portion of said first silicon oxynitride layer covers said second barrier metal layer within said openings.

23. The method according to claim 14 wherein said step of removing said polymer comprises ashing using an alkaline stripper.

24. A method of forming metal lines in the fabrication of an integrated circuit comprising:
- providing an insulating layer on a semiconductor substrate;
- depositing a first barrier metal layer overlying said insulating layer;
- depositing a metal layer overlying said barrier metal layer;
- depositing a second barrier metal layer overlying said metal layer;
- depositing a composite hard mask layer overlying said second barrier metal layer wherein said composite hard mask layer comprises a first layer of silicon oxynitride underlying a second layer of silicon oxide underlying a third layer of silicon oxynitride;
- forming a photoresist mask overlying said composite hard mask layer having openings where openings are to be made within said metal layer;
- first partially etching away said third and second layers of said composite hard mask layer where it is not covered by said photoresist mask with an etch stop at said first silicon oxynitride layer;

second overetching away most of remaining said first silicon oxynitride layer of said composite hard mask layer not covered by said photoresist mask leaving a patterned hard mask and a portion of said first silicon oxynitride layer within said openings whereby a polymer is formed within said openings on the sidewalls of said patterned hard mask and wherein said polymer is non-metallic;

removing said photoresist mask;

thereafter removing said polymer;

thereafter third etching away said metal layer and said first and second barrier metal layers not covered by said patterned hard mask to form said metal lines wherein said portion of said first silicon oxynitride layer of said composite hard mask layer within said openings is also removed; and completing said fabrication of said integrated circuit.

25. The method according to claim 24 wherein said first barrier layer comprises a titanium layer having a thickness of between about 200 and 300 Angstroms underlying a titanium nitride layer having a thickness of between about 250 and 350 Angstroms.

26. The method according to claim 24 wherein said metal layer comprises AlCu having a thickness of between about 4000 and 5000 Angstroms.

27. The method according to claim 24 wherein said second barrier layer comprises titanium nitride having a thickness of between about 250 and 350 Angstroms.

28. The method according to claim 24 wherein said step of first partially etching away said composite hard mask layer comprises $C_2F_6$, $C_4F_8$, $O_2$, and Ar chemistry.

29. The method according to claim 24 wherein said step of second overetching away most of said composite hard mask layer comprises $C_2F_6$, $C_4F_8$, CO, and Ar chemistry.

30. The method according to claim 24 wherein said step of removing said polymer comprises ashing using an alkaline stripper.

* * * * *